United States Patent [19]
Kojima

[11] Patent Number: 5,644,528
[45] Date of Patent: Jul. 1, 1997

[54] NON-VOLATILE MEMORY HAVING A CELL APPLYING TO MULTI-BIT DATA BY MULTI-LAYERED FLOATING GATE ARCHITECTURE AND PROGRAMMING METHOD FOR THE SAME

[75] Inventor: Toshiaki Kojima, Sendai, Japan

[73] Assignee: Motorola, Inc., Schaumburg, Ill.

[21] Appl. No.: 563,885

[22] Filed: Nov. 21, 1995

[30] Foreign Application Priority Data

Nov. 29, 1994 [JP] Japan .................................. 6-295162

[51] Int. Cl.$^6$ .................................................. G11C 11/34
[52] U.S. Cl. .............................. 365/185.03; 365/185.01; 365/185.18
[58] Field of Search ........................ 365/185.03, 185.01, 365/185.18; 257/315, 314

[56] References Cited

U.S. PATENT DOCUMENTS

| | | | |
|---|---|---|---|
| 5,159,570 | 10/1992 | Mitchell et al. | 365/185.03 |
| 5,422,845 | 6/1995 | Ong | 365/185.18 |

OTHER PUBLICATIONS

A Functional MOS Transistor Featuring Gate-Level Weighted Sum and Threshold Operations, Shibata et al, IEE Transactions on Electron Devices, vol. 39, No. 6, Jun. 1992, pp. 1444–1455.

New Ultra–High Density Textured Poly–Si Floating Gate EEPROM Cell, Guterman et al, Reprint pp. 146–184 from IEDM Tech. Dig., pp. 826–828, Dec. 1986.

*Primary Examiner*—David C. Nelms
*Assistant Examiner*—Huan Hoang
*Attorney, Agent, or Firm*—Harry A. Wolin; Sharon K. Coleman

[57] ABSTRACT

An object of the present invention is to contribute to increase of storage capacity of a memory. A nonvolatile memory having a cell applying to multi-bit data by multi-layered floating gate architecture. The memory has a storage cell transistor which comprises a semiconductor substrate 1, source 2, drain 3 and control gate 5. The storage cell transistor, furthermore comprises a plurality of floating gates $4B_1$–$4B_n$ which are arranged in order between a channel and the control gate. Two or more bits data can be saved per one storage cell. According to this architecture, an integration factor per one storage cell leaps upward since a necessary number of floating gates are stacked to overlie each other, the particular number corresponding to the number of bits to be stored therein.

6 Claims, 10 Drawing Sheets

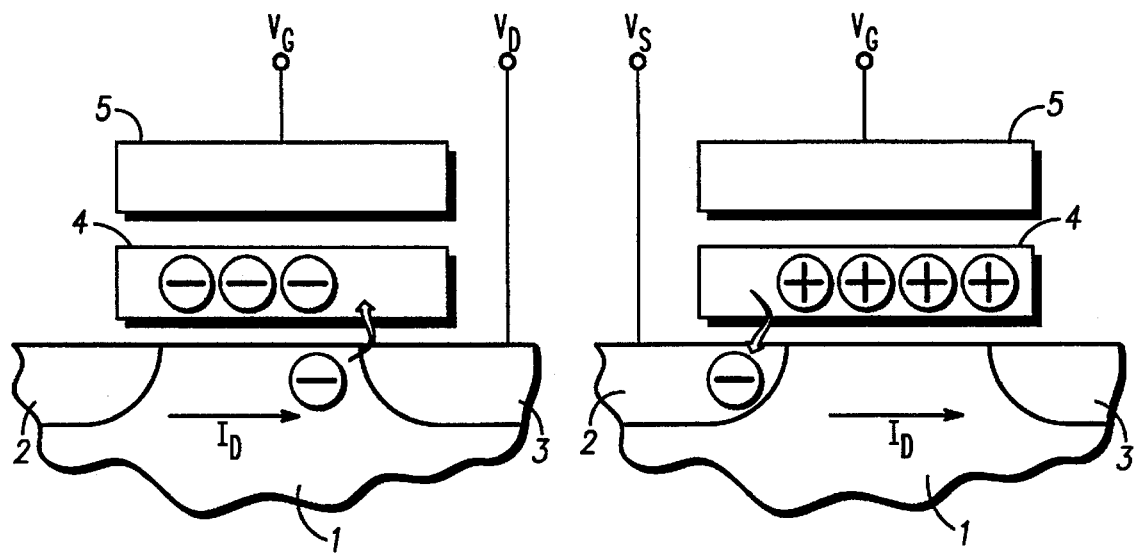
FIG. 1A
— PRIOR ART —
FIG. 1B
— PRIOR ART —
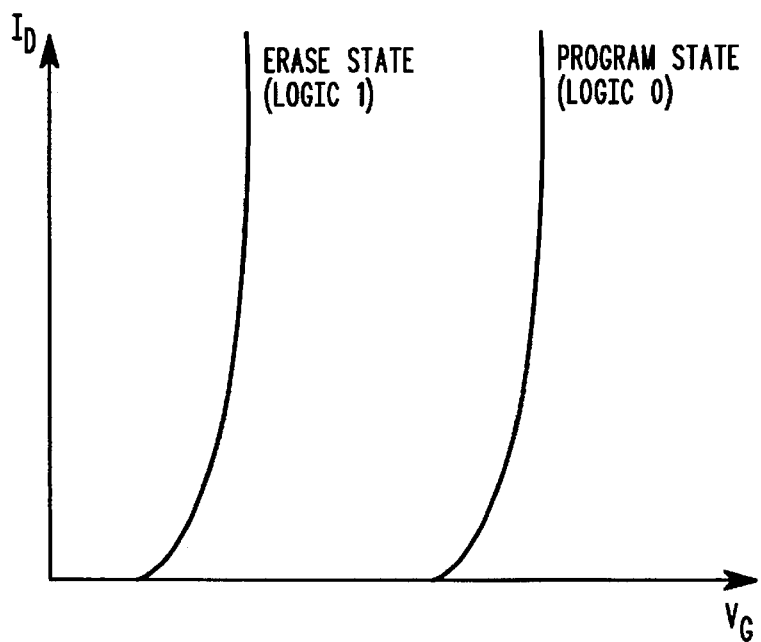
FIG. 2
— PRIOR ART —

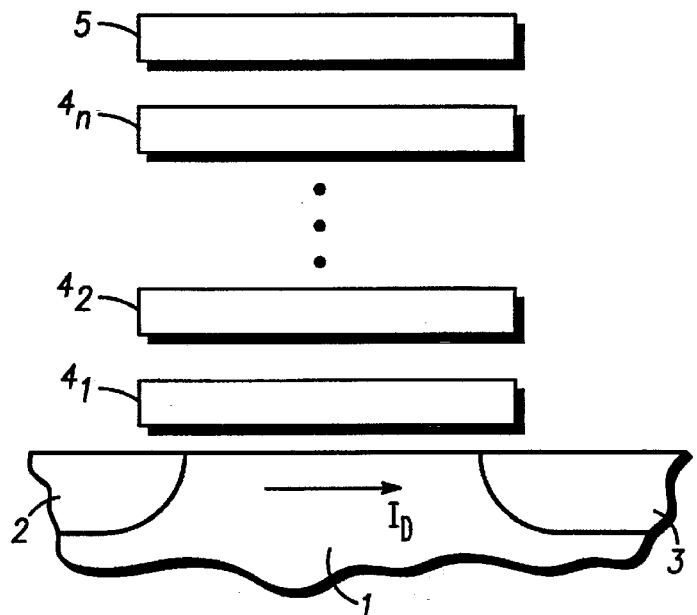
FIG. 3
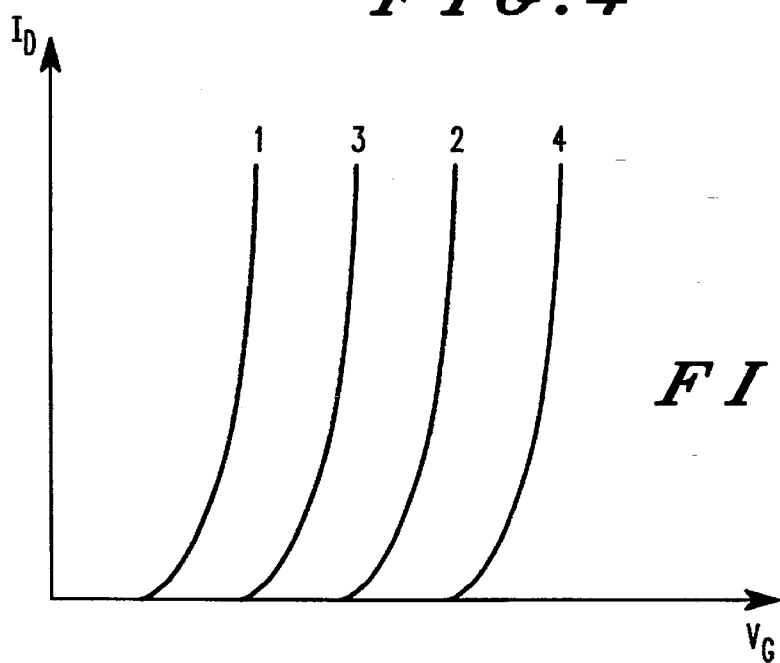
FIG. 4
FIG. 5

NON-VOLATILE MEMORY HAVING A CELL APPLYING TO MULTI-BIT DATA BY MULTI-LAYERED FLOATING GATE ARCHITECTURE AND PROGRAMMING METHOD FOR THE SAME

TECHNICAL FIELD

The present invention relates to a non-volatile memory, and in particular, to a memory in which a storage cell is comprised of a transistor having a floating gate architecture.

BACKGROUND

One of non-volatile memories in which a storage cell is comprised of a transistor having a floating gate and a control gate is described, for example, in "Complete Transient Simulation of Flash E²PROM Devices" by S. Keeny et al., Ie ED-39, No. 12 Dec., 1992". The basic structure of this storage cell is illustrated in FIG. 1.

In FIG. 1(a) and FIG. 1(b), the storage cell is comprised of a MOS field-effect transistor (typically, a so-called SAMOS transistor) having source 2 and drain 3 formed on a substrate 1 made of an impurity semiconductor, such as p-type silicon; a floating gate 4 disposed along and above a channel between the source and drain, and also surrounded by an oxide; a control gate 5 formed above the gate 4 and separated by the oxide therefrom. FIG. 1 (a) depicts how a write or programming is performed to the cell, when the gate voltage $V_G$ and drain voltage $V_D$ are raised to high levels, hot electrons are generated, which are stored onto the floating gate 4. FIG. 1(b) depicts how information stored on the cell is erased, where raising the source voltage $V_s$ to a high level causes the electrons stored on the floating gate 4 are pulled into the source 2, so that holes are stored on the floating gate 4. In other words, by controlling the carriers in the floating gate 4, an information storage state is produced in one cell. For example, the programming state is assigned to "0", and the erasure state to "1".

FIG. 2 shows drain current $I_D$ vs. gate voltage $V_G$ characteristics in programming and erasure states of the memory cell.

However, one cell assumes only two states; thus, because it stores only binary information (i.e., one bit of binary data), it has a disadvantage for recent trends toward expanding memory capacity.

It is an object of the present invention to provide a non-volatile memory which is amenable to increasing memory capacity, and a method of programming it.

SUMMARY OF THE INVENTION

A non-volatile memory according to the present invention is characterized by a storage cell transistor comprising: source and drain being formed in a semiconductor substrate distantly from each other so as to form a channel therebetween; a control gate facing said channel; and a plurality of floating gates arranged in order between said channel and said control gate. A non-volatile memory according to the present invention is characterized by a storage cell transistor comprising: source and drain being formed in a semiconductor substrate distantly from each other so as to form a channel therebetween, and a control gate facing said channel, said storage cell transistor further comprising at least one first floating gate having a width extending from said source to said drain, said at least one floating gate extending in a direction crossing to the separating direction of said source and drain, and arranged in order between said channel and said control gate; a first program gate facing one of the extending ends of said first floating gate from said channel; a first erasure gate facing the other extending end of said first floating gate from said control gate; at least one second floating gate facing said first floating gate, said at least one second floating gate extending in a direction crossing to the extending direction of said first floating gate, and arranged in order between said channel and said control gate; a second program gate facing one of the extending ends of said second floating gate from said channel; a second erasure gate facing the other extending end of said second floating gate from said control gate; a first bias gate facing said first floating gate from said control gate in locations excluding those overlapping locations where said first and second floating gates overlap with each other in the orientation of said first or second floating gate; and a second bias gate facing said second floating gate from said control gate in locations excluding said overlapping locations. A method of programming the afore-described nonvolatile memory comprises the steps of: applying a positive high voltage to said bias gate; setting said program gate and said erasure gate to a predetermined reference potential; and injecting electrons produced by the resulting tunnel current into said second floating gate. A method of erasing information from the above-described memory comprises the steps of: applying a positive high voltage to said erasure gate; and setting said bias gate and said program gate to a predetermined reference potential.

With a non-volatile memory having a cell applying to multi-bit data by multi-layered floating gate architecture, and method of programming the same, the floating gate on each layer stores carriers corresponding to each data bit, so that the threshold for drain current is determined depending on the amount of capacitance coupling of the carriers stored. Additionally, according to the present invention, electrons resulting from tunnel current are injected individually into each floating gate by the bias gate to which a positive high potential is applied and the program and erasure gates which are set to a predetermined reference potential. Furthermore, electrons injected into each floating gate are emitted individually by the erasure gate to which a positive high voltage is applied and the bias and program gates which are set to a predetermined reference potential.

BRIEF DESCRIPTION OF THE DRAWINGS

FIG. 1(a) and FIG. 1(b) are a cross-sectional view depicting a basic structure of a storage cell comprising a transistor having a floating gate and a control gate.

FIG. 2 shows drain current, $I_D$, vs. gate voltage, $V_G$, characteristics in the program and erasure modes for the memory cell of FIG. 1(a) and FIG. 1b.

FIG. 3 is a cross-sectional view depicting the structure of a storage cell of a non-volatile memory according to one embodiment of the present invention.

FIG. 4 shows in tabular form the storage states of the storage cell where the floating gates are formed on two layers, based on the structure of FIG. 3.

FIG. 5 shows drain current, $I_D$, vs. drain voltage $V_D$, characteristics in each storage state in the table of FIG. 4.

DETAILED DESCRIPTION OF THE PREFERRED EMBODIMENT

Figure 6:
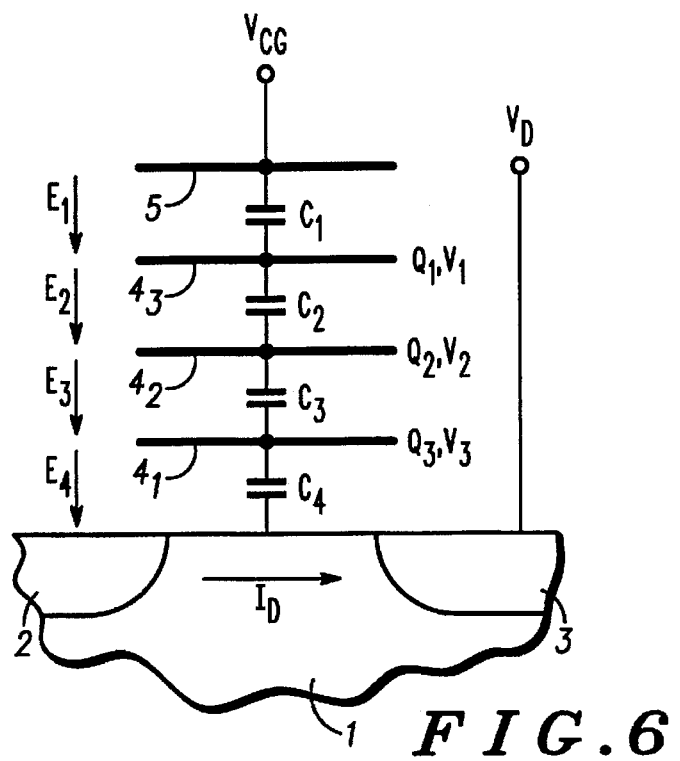
FIG. 6 shows an equivalent circuit of the storage cell where the floating gates are formed on three layers, based on the structure of FIG. 3.

The present invention will be described in greater detail below, with reference to the drawings.

FIG. 3 shows the structure of the storage cell of a non-volatile memory according to one embodiment of the present invention, where like reference numerals refer to the same or equivalent parts.

In FIG. 3, the transistor of such a storage cell has a source 2 and a drain 3 formed distantly from each other in a substrate 1 formed of an impurity semiconductor, such as p-type silicon, and first to n-th floating gates $4_1$–$4_n$ (n is an integer equal to or greater than 2) formed along and above the source-to-drain channel in order (or stacked), and surrounded by an oxide, for example, respectively. Furthermore, a control gate 5 is stacked through the oxide onto the floating gate $4_n$ on the n-th or uppermost layer. The floating gate and control gate are formed of polysilicon, for example, and the oxide is formed of $SiO_2$.

For each floating gate, electrons (or holes) are charged, i.e., information is programmed, with a programming technique described later, and also electrons charged are emitted, i.e., information is erased, with an erasing technique based on ultraviolet irradiation, or an electrical erasure technique based on Fowler-Nordheim field emission. As may become apparent later, the carriers charged on each floating gate controls the level of drain current $I_D$. Thus, by making each floating gate correspond to each data bit to be stored and charging carriers to the floating gate in response to that bit data, the same number of bits of data as that of floating gates can be stored.

FIG. 4 shows storage states of the cell with two floating gates. With this structure, if a neutral state corresponds to a logic "1" and an electron charged state corresponds to a logic "0" for a first-layered floating gate $4_1$ and second-layered floating gate $4_2$, then this cell produces four combinations of states.

FIG. 5 shows the resulting drain current $I_D$ vs. gate voltage $V_G$ characteristics. This indicates that four combinations of drain current values obtained relative to the gate voltage are all different, and that the threshold values for the drain current increase in order from 1, 3, 2, and 4 representative of the states of the drain current in the table of FIG. 5, so that four kinds of storage states are produced for one cell.

More specifically, the threshold voltage, Vth, of the MOSFET of the single-floating gate architecture as shown in FIG. 1 may be expressed as follows:

$$Vth = 2f_F + \sqrt{2e_s q N_B \cdot 2f_F} \ /C_{ox} - C_{ss}/C_{ox}$$

where:

$f_F$=a difference between energy $E_i$ at the center of the forbidden band and Fermi level $E_F$;

$e_s$=dielectric constant of semiconductor substrate 1;

q=raw charge amount of electrons;

$N_B$=substrate density;

$Q_{ss}$=surface level charge or trap level; and $C_{ox}$=capacitance of oxide lying between substrate 1 and floating gate.

The charge stored in the floating gate of multi-layered type as in this embodiment may be considered the same as the trap level charge. Furthermore, in the above equation, the term $Q_{ss}/C_{ox}$ may be written as $Q_{ss}/C_{ox}=t_{ox} \cdot Q_{ss}/e_{ox}$ (where $t_{ox}$ is the thickness of the intermediate oxide, and $e_{ox}$ is the dielectric constant of the intermediate oxide). Thus, the higher the trap level, or the more distant is the position of the floating gate relative to the substrate in this case, the greater the value of the term $Q_{ss}/C_{ox}$. Since the electron charge assumes negative polarity, the floating gate far apart from the substrate has a greater threshold voltage. Therefore, even if the same amount of charge is injected into the floating gates $4_1$ and $4_2$, electrons charged into the floating gate $4_2$ cause the threshold voltage of the transistor to be higher, thus resulting in four threshold voltages as shown in FIG. 5.

Similarly, if the n number of floating gates are provides as shown in FIG. 3, $2^n$ types of storage states are produced.

This aspect may be further analyzed as follows.

First, FIG. 6 shows an equivalent circuit of a storage cell comprised of four-layered polysilicon gates, i.e., three floating gates and a control gate, according to the architecture of the storage cell of FIG. 3. In this equivalent circuit, the oxide lying between the control gate 5 and the uppermost-layered floating gate $4_3$ is replaced with capacitance $C_1$ to which potential $V_{CG}$ is given; the oxide lying between the uppermost-layered floating gate $4_3$ into which charge $Q_1$ is injected and the middle-layered floating gate $4_2$ into which charge $Q_2$ is injected is replaced with capacitance $C_2$ to which potential $V_1$ is given; the oxide lying between the middle-layered floating gate $4_2$ and the lowermost-layered floating gate $4_1$ into which charge $Q_3$ is injected is replaced with capacitance $C_3$ to which potential $V_2$ is given; and the oxide lying between the lowermost-layered floating gate $4_1$ and substrate 1 is replaced with capacitance $C_4$ to which potential $V_3$ is given. Thus, these capacitances are connected in series via the polysilicon, so that fields $E_1$ through $E_4$ are applied to the capacitances. First, with this configuration, a certain amount of charge must be conserved between these gates. That is:

$$eE_1 = eE_2 + Q_1 = eE_3 + Q_2 = eE_4 + Q_3 \quad (1)$$

where e is the dielectric constant of the oxide between gates. Rewriting the field $E_1$–$E_4$ with $C_1$–$C_4$, potentials $V_{CG}$, $V_1$–$V_3$ and potential $VL_{SUB}$ of substrate 1 yields:

$$\begin{aligned} C_1(V_{CG} - V_1) &= C_2(V_1 - V_2) + Q_1 \\ &= C_3(V_2 - V_3) + Q_2 \\ &= C_4(V_3 - V_{SUB}) \end{aligned} \quad (2)$$

From Eq. (2), the following equations are derived:

$$-(C_1+C_2)V_1 + C_2V_2 = Q_1 - C_1V_{CG} \quad (3.1)$$

$$C_2V_1 - (C_2+C_3)V_2 + C_3V_3 = -Q_1 + Q_2 \quad (3.2)$$

$$C_3V_2 - (C_3+C_4)V_3 = -Q_2 + Q_3 + C_4V_{SUB} \quad (3.2)$$

The above equations may be written as a matrix for voltages $V_1$–$V_3$.

$$\begin{bmatrix} -(C_1+C_2) & C_2 & 0 \\ C_2 & -(C_2+C_3) & C_3 \\ 0 & C_3 & -(C_3+C_4) \end{bmatrix} \begin{bmatrix} V_1 \\ V_2 \\ V_3 \end{bmatrix} = \begin{bmatrix} Q_1 - C_1V_{CG} \\ -Q_1 + Q_2 \\ -Q_2 + Q_3 + C_4V_{SUB} \end{bmatrix} \quad (4)$$

Solving this equation yields voltages $V_1$–$V_3$ for the floating gates given some gate voltage $V_{CG}$. It should be noted that when the gate voltage $V_{CG}$ is equal to the threshold voltage $V_{CG}^*$, then $V_{SUB} = 2f_F$ (where $fF$ is a difference between energy $E_i$ at the center of the forbidden band and Fermi level $E_F$). This may be given by:

$$\begin{bmatrix} -(C_1+C_2) & C_2 & 0 \\ C_2 & -(C_2+C_3) & C_3 \\ 0 & C_3 & -(C_3+C_4) \end{bmatrix} \begin{bmatrix} V_1 \\ V_2 \\ V_3 \end{bmatrix} = \begin{bmatrix} Q_1 - C_1V_{CG}^* \\ -Q_1 + Q_2 \\ -Q_2 + Q_3 + 2C_4f_4 \end{bmatrix} \quad (5)$$

In this case, because $V_{CG}^*$ is unknown, another equation is required, which is given by:

$$C_3(V_3 - 2f_F) = \sqrt{2e_sqN_B(2f_F)} \quad (6)$$

where:
$e_s$ = a dielectric constant of semiconductor substrate 1;
q = the amount of raw charge of electron; and $N_s$ = a substrate density.
Thus, solving Eqs. (5) and (6) yields $V_{CG}^*$.

Then, the drain current $I_D$ may be expressed as:

$$I_D = \mu_o C_3 W \{(V_3 - V_3^*)V_D - V_D^2/2\}/L \quad (7)$$

where $\mu_o$ = an electron transfer velocity;

W = a channel width; and

L = an effective channel length.

It should be noted here that $V_3^*$ is the potential of $V_3$ when $V_{CG} = V_{CG}^*$.

Figure 7:
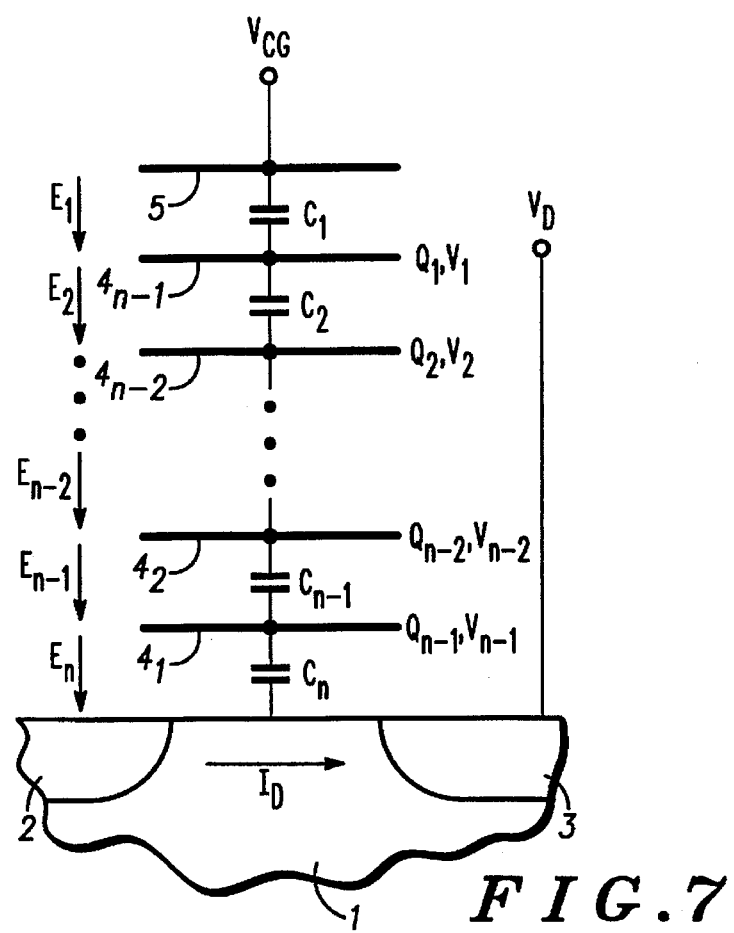
FIG. 7 shows an equivalent circuit of the storage cell where the floating gates are formed on n-1 layers, based on the structure of FIG. 3.

If this concept is expanded to n-layered polysilicon gates including control gates, as shown in FIG. 7, then the voltage for each floating gate is matfixed as follows:

$$\begin{pmatrix} -(C_1+C_2) & C_2 & 0 & \ldots 0 & 0 & 0 \\ C_2 & -(C_2+C_3) & C_3 & \ldots 0 & 0 & 0 \\ 0 & C_3 & -(C_3+C_4) & \ldots 0 & 0 & 0 \\ \cdot & \cdot & \cdot & \cdot & \cdot & \cdot \\ \cdot & \cdot & \cdot & \cdot & \cdot & \cdot \\ \cdot & \cdot & \cdot & \cdot & \cdot & \cdot \\ 0 & 0 & 0 & \ldots C_{n-2} & -(C_{n-2}+C_{n-1}) & C_{n-1} \\ 0 & 0 & 0 & \ldots 0 & C_{n-1} & -(C_{n-1}+C_n) \end{pmatrix} \begin{pmatrix} V_1 \\ V_2 \\ V_3 \\ \cdot \\ \cdot \\ \cdot \\ V_{n-2} \\ V_{n-1} \end{pmatrix} = \begin{pmatrix} Q_1 - C_1kV_{CG} \\ -Q_1 + Q_2 \\ -Q_2 + Q_3 \\ \cdot \\ \cdot \\ \cdot \\ Q_{n-3} + Q_{n-2} \\ Q_{n-2} + Q_{n-1} + C_nV_{SUB} \end{pmatrix} \quad (8)$$

For threshold voltage $V_{CG}{}^*$, $V_{SUB}=2f_F$ in Eq. (8), so that the following equation is derived:

$$\begin{pmatrix} -(C_1+C_2) & C_2 & 0 & \ldots 0 & 0 & 0 \\ C_2 & -(C_2+C_3) & C_3 & \ldots 0 & 0 & 0 \\ 0 & C_3 & -(C_3+C_4) & \ldots 0 & 0 & 0 \\ \cdot & \cdot & \cdot & \cdot & \cdot & \cdot \\ \cdot & \cdot & \cdot & \cdot & \cdot & \cdot \\ \cdot & \cdot & \cdot & \cdot & \cdot & \cdot \\ 0 & 0 & 0 & \ldots C_{n-2} & -(C_{n-2}+C_{n-1}) & C_{n-1} \\ 0 & 0 & 0 & \ldots 0 & C_{n-1} & -(C_{n-1}+C_n) \end{pmatrix} \begin{pmatrix} V_1 \\ V_2 \\ V_3 \\ \cdot \\ \cdot \\ \cdot \\ V_{n-2} \\ V_{n-1} \end{pmatrix} = \begin{pmatrix} Q_1 - C_1 V_{CG}{}^* \\ -Q_1 + Q_2 \\ -Q_2 + Q_3 \\ \cdot \\ \cdot \\ \cdot \\ Q_{n-3} + Q_{n-2} \\ Q_{n-2} + Q_{n-1} + 2C_n f_F \end{pmatrix} \quad (9)$$

To obtain $V_{CG}{}^*$ from this, it is necessary to solve the following equation at the same time:

$$C_n(V_{n-1} - 2f_F) = \sqrt{2e_s q N_B(2f_F)} \quad (10)$$

Then, the drain current $I_D$ is given by:

$$I_D = \mu_o C_n W \{(V_{n-1} - V_{n-1}{}^*) V_D - V_D{}^2/2\}/L \quad (11)$$

As shown in FIG. 5, for the drain current relative to the gate voltage to be different depending on each storage state, $C_1$–$C_n$ values and $Q_1$–$Q_{n-1}$ values may be set such that $2^{2-1}$ types of $V_{CG}{}^*$ values are derived. $C_1$–$C_n$ values are determined by their electrode area, i.e., the facing area of each gate, and electrode space, i.e., the distance between the gates. It also depends on the properties of the intermediate material between the gates. Thus, any of the parameters determining these capacitance values may be set as desired when configuring the storage cell. Furthermore, $Q_1$–$Q_{n-1}$ values are determined by the injection energy when electrons are injected into each floating gate during programming.

It has been explained that providing multi-layered floating gates stacked on the substrate and storing into them carriers corresponding to each bit data allows a single cell to assume multiple data bits; now, a specific method of storing carriers, that is, programming and erasing methods are described.

Figure 8:
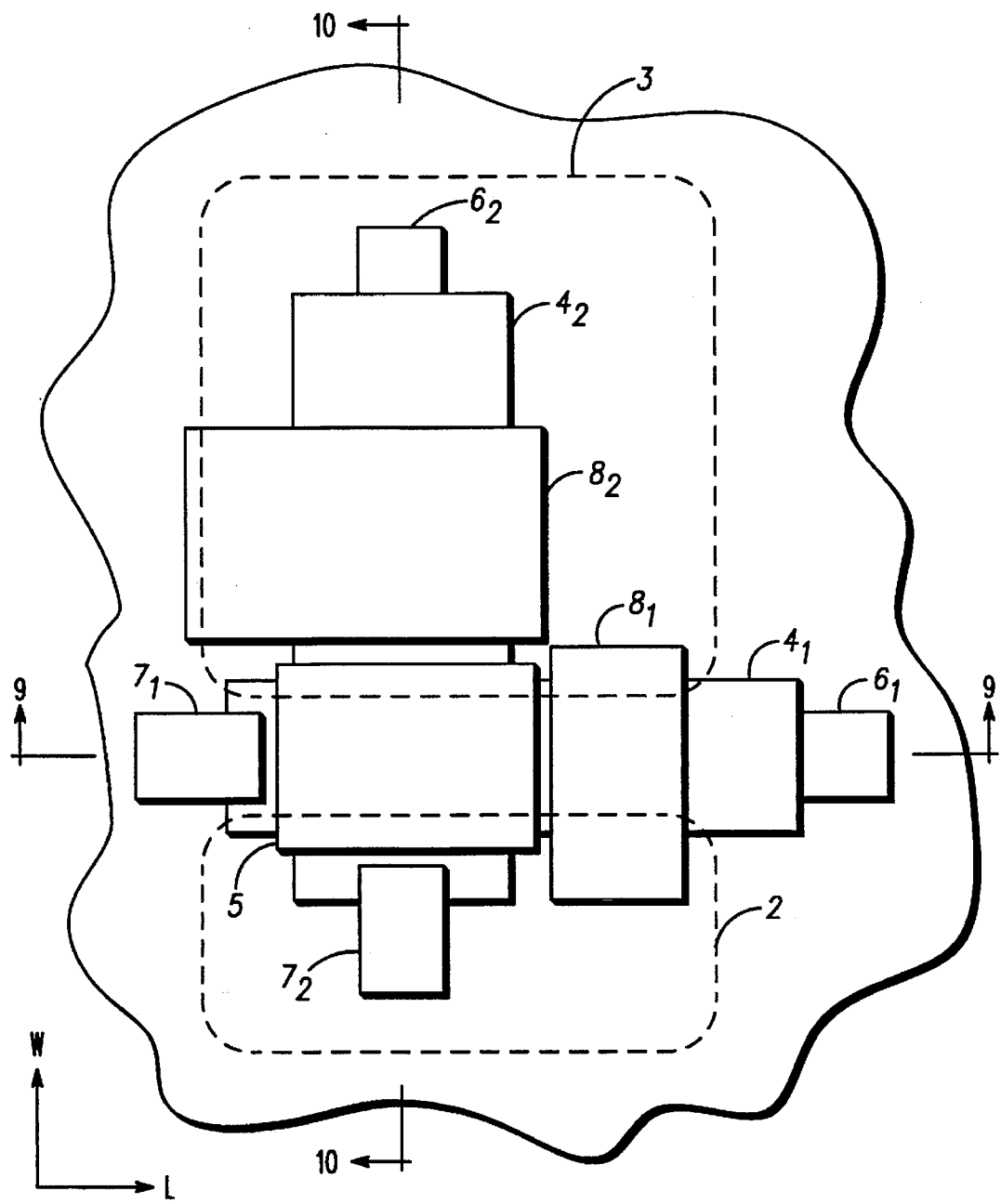
FIG. 8 is a plan view depicting the structure of the storage cell where the floating gates are formed on four layers, based on the structure of FIG. 3, and carriers are stored on each floating gate by use of tunneling.
Figure 9:
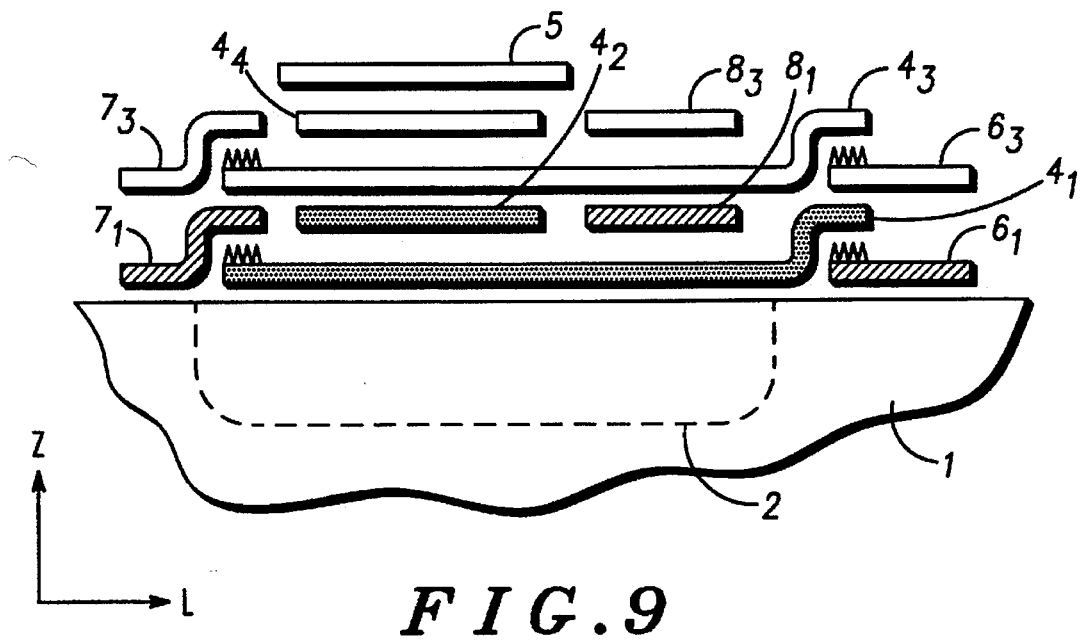
FIG. 9 is a cross-sectional view seen along 9—9 of the storage cell of FIG. 8.
Figure 10:
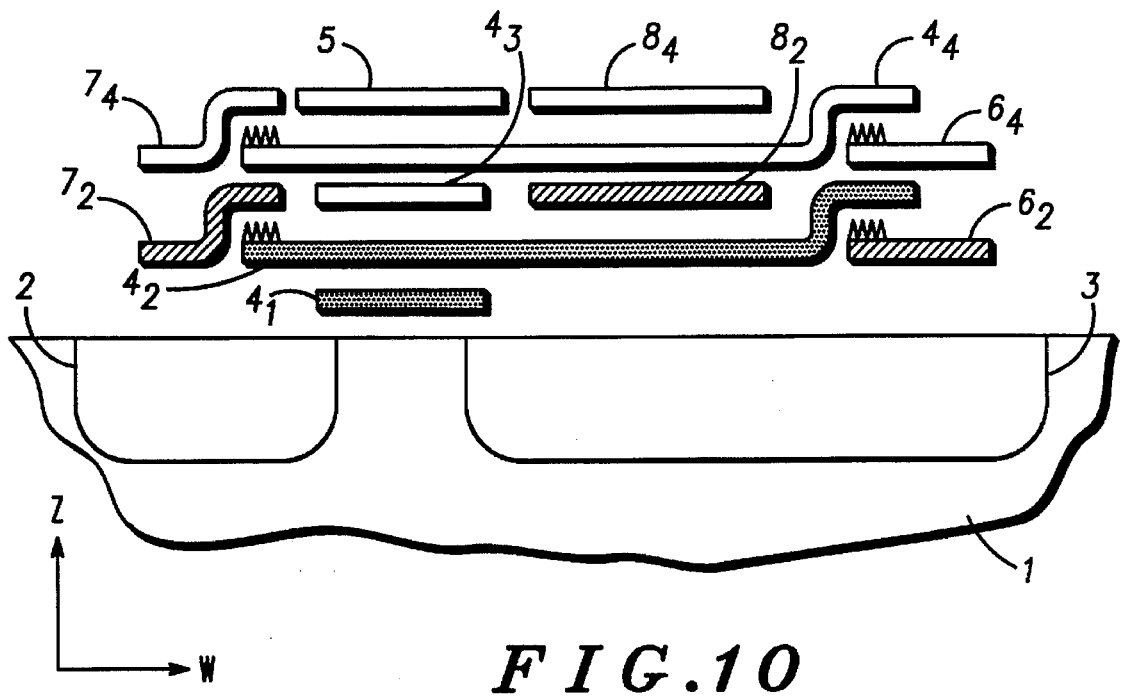
FIG. 10 is a cross-sectional view seen along 10—10 of the storage cell of FIG. 8.

FIGS. 8–10 depict the architecture of the storage cell where programing and erasure of stored data is performed on each of the floating gates on the four layers, by use of the afore-described Fowler-Nordheim tunneling. FIG. 8 is a plane view of a structural block associated with some layer in the cell; FIG. 9 is a cross-sectional view seen from 9—9 of FIG. 8; FIG. 10 is a cross-sectional view seen from 10—10 of FIG. 8. It is appreciated that like reference numerals refer to the equivalent or like parts of FIG. 3.

In FIGS. 8–10, source 2 and drain 3 are formed distantly from each other in direction W on a semiconductor substrate 1. A floating gate $4_1$ on the first layer, i.e., the lowermost layer, formed of polysilicon, for example, is surrounded by an oxide, such as $SiO_2$, and has a certain width from the drain end of source 2 to the source end of drain 3, and is formed in rectangular shape that extends in direction L perpendicular to the source-drain separating direction, i.e., direction W. More specifically, the end including a first side along the extending direction of the rectangular floating gate $4_1$ overlaps the drain end of source 2 via the oxide, while the end including a third side opposite to the first side overlaps the source end of drain 3 via the oxide. Between the end including the underlying layer, i.e., a second side, of one extending end of the floating gate $4_1$ and the substrate 1 excluding source 2 and drain 3 regions is disposed a polysilicon gate (hereinafter referred t as "programming gate") $6_1$. A polysilicon gate (hereinafter referred to as "erasure gate") $7_1$ is stacked via an oxide onto the overlying layer of the other extending end of the floating gate $4_1$, i.e., the end including a fourth side opposite to the second side. Thus, the floating gate $4_1$ is sandwiched by the programming gate $6_1$ and erasure gate $7_1$ in the Z direction between the end including the second side and the end including the fourth side. On the floating gate $4_1$ is stacked a polysilicon gate (hereinafter referred to as "bias gate") $8_1$ extending in the W direction and having a certain width, ranging from the source 2 to the drain 3, as closer to the program gate $6_1$.

Furthermore, a second-layered floating gate $4_2$ formed, for example, of polysilicon is surrounded by an oxide such as $SiO_2$, and also stacked through that oxide closer to the erasure gate $7_1$ on the underlying-layered floating gate $4_1$. The floating gate $4_2$ is formed in a rectangular form extending from near the center of the source 2 region to near the center of the drain 3 region, with a predetermined L-direction width along the W direction perpendicular to the extending direction of the underlying-layered floating gate $4_1$. More specifically, the end including a first side of the rectangular floating gate $4_2$ overlaps a portion of the source 2 region through the oxide, while the end including a third side opposite to the first side overlaps a portion of the drain 3 region through the oxide. A programming gate $6_2$ is disposed on the underlying layer at one extending end of the floating gate $4_2$, i.e., the underlying layer at the end including the third side. An erasure gate $7_2$ is stacked through the oxide onto the overlying layer at the other extending end of the floating gate $4_2$, i.e., the end including the first side opposite to the third side. Thus, the floating gate $4_2$ is overlapped or crossed to the underlying-layered floating gate $4_1$ through the oxide, and sandwiched in the Z direction between the end including the third side and the end including the first side by the programming gate $6_2$ and erasure gate $7_2$. On the floating gate $4_2$ is stacked a bias gate $8_2$ which crosses and extends along the L direction with a predetermined width relative to the floating gate $4_2$, as closer to the program gate $6_2$.

On the surfaces of the programming gates $6_1$ and $6_2$, asperities are formed in the overlapping portion of the floating gates $4_1$ and $4_2$. Also on the surfaces of the floating gates $4_1$ and $4_2$, asperities are formed in the overlapping portion of the erasure gates $7_1$ and $7_2$. These asperities play an important role in the programming and erasure modes described later. The first- and second-layered floating gate $4_1$ and $4_2$ each form a pair of one-bit block with the programming gate $6_1$, erasure gate $7_1$, and bias gate $8_1$, and with the programming gate $6_2$, erasure gate $7_2$, and bias gate $8_2$, respectively. The structure of the one-bit block including the first-layered floating gate $4_1$ shown is similar to that of the one-bit block including the floating gate on the other odd-numbered layer as counted from the lowermost-layered floating gate $4_1$, while the structure of the one-bit block including the second-layered floating gate $4_2$ shown is similar to that of the one-bit block including the floating gate on the other even-numbered layer as counted from the lowermost-layered floating gate $4_1$. Thus, the one-bit block including the third-layered floating gate $4_3$ is configured similar to the one-bit block including the first-layered floating gate $4_1$, while the one-bit block including the fourth-layered floating gate $4_4$ is configured similarly to the one-bit block including the second-layered floating gate block $4_2$.

On top of the uppermost floating gate $4_4$ is stacked the control gate 5 such that it covers the portions of the floating gates that overlap through the oxide.

One characteristic of such a structure is that the floating gates are stacked alternately in their L and W extending directions so that the thickness between the floating gates is not increased. This allows the programming, erasure and bias gates to be formed regardless of their overlapping position, thereby offering advantages that the thickness between the floating gates can be controlled easily and thus the capacitance value of the equivalent circuit described above can be set easily. Furthermore, there is another advantage that the number of polysilicon layers for the entire cell, including gates other than the floating gates, can be reduced.

Figure 11:
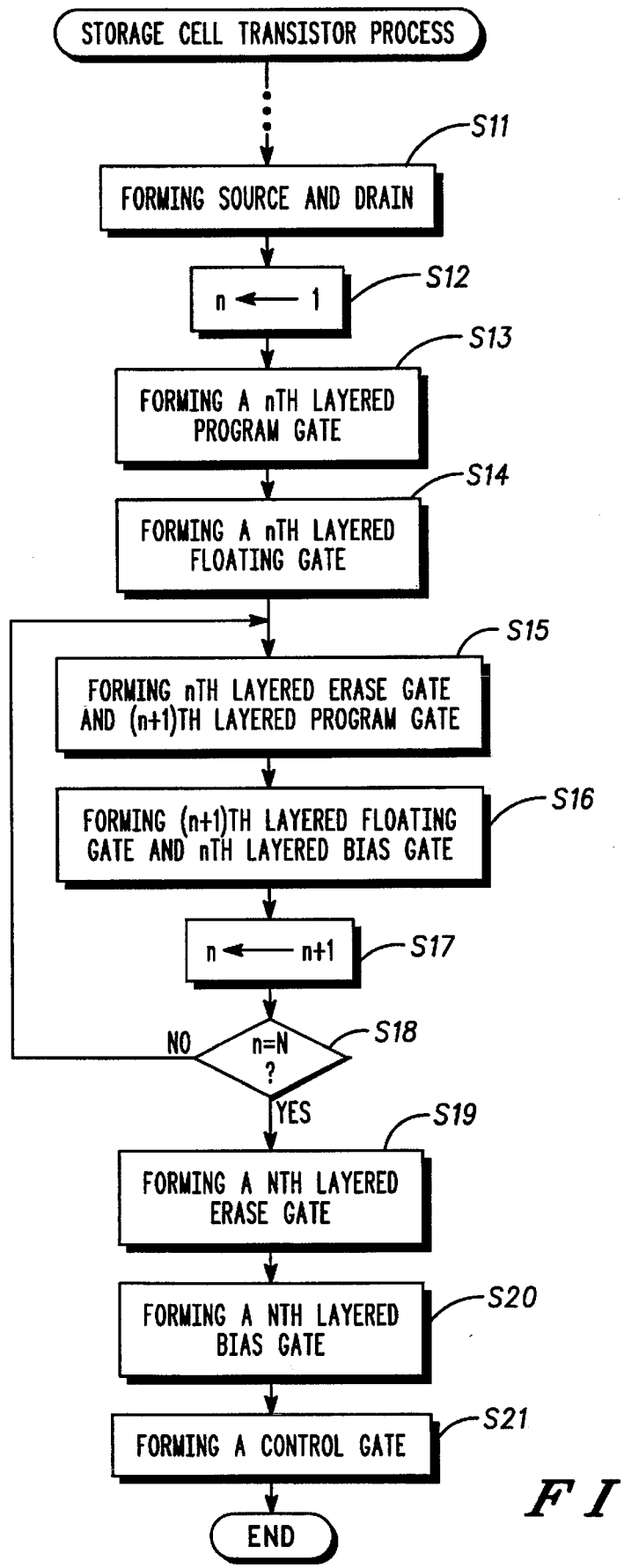
FIG. 11 is a flowchart illustrating the manufacturing process for the N-layered floating gate storage cell transistor formed based on the structure of FIGS. 8–10.

On the other hand, the cell manufacturing process is performed in order of:

1) formation of source 2 and drain 3;
2) formation of programming gate $6_1$;
3) formation of floating gate $4_1$;
4) formation of erasure gate $7_1$ and programming gate $6_2$;
5) formation of floating gate $4_2$ and bias gate $8_1$;
6) formation of erasure gate $7_2$ and programming gate $6_3$;

Considering a typical storage cell transistor where an N number of layered gates (N is an integer equal to or greater than 2), the manufacturing process may be described as by a flow shown in FIG. 11.

It should be noted that FIG. 8 is a plan view for only illustrating the one-bit block including the first-layered floating gate, one bit-block including the second-layered floating gate, and control gate 5, with the one-bit blocks including the third and fourth-layered floating gates omitted. It should also be noted that in FIGS. 9 and 10, the first- and second-layered floating gates are represented by solid-black portions, while their corresponding programming, erasure and bias gates are hatched.

Figure 12:
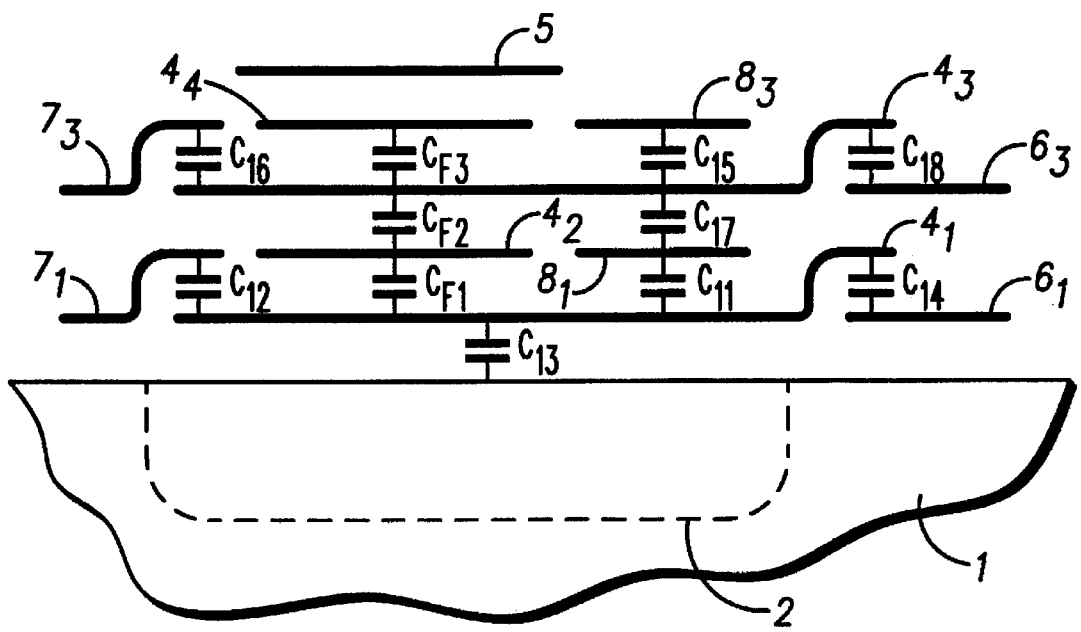
FIG. 12 is an equivalent circuit diagram of bit blocks including first- and third-layered floating gates of the storage cell of FIGS. 8–10.

The equivalent circuit of such a storage cell transistor is shown in FIG. 12 according to the cross-sectional view of FIG. 9. As shown in FIG. 12, for the first bit block, the oxides between the bias gate $8_1$ and first-layered floating gate $4_1$, between the first-layered floating gate $4_1$ and erasure gate $7_1$, between the substrate 1 and first-layered floating gate $4_1$, and between the first-layered floating gate $4_1$ and programming gate $6_1$ may be substituted by capacitors $C_{11}$, $C_{12}$, $C_{13}$, and $C_{14}$, respectively. For the third bit block, the oxides between the bias gate $8_3$ and third-layered floating gate $4_3$, between the third-layered floating gate and erasure gate $7_3$, between the bias gate $8_1$ and third-layered floating gate $4_3$, and between the third-layered floating gate $4_3$ and programming gate $6_3$ may be substituted by capacitors $C_{15}$, $C_{16}$, $C_{17}$, and $C_{18}$, respectively. And the oxides between the floating gates may be substituted by capacitors $C_{F1}$–$C_{F3}$, respectively. This is further rewritten to form circuit diagrams of FIG. 13 and FIGS. 17–19 for explaining I. Programming Mode and II. Erasure Mode, which will be described later.

I. Program Mode

Figure 13:
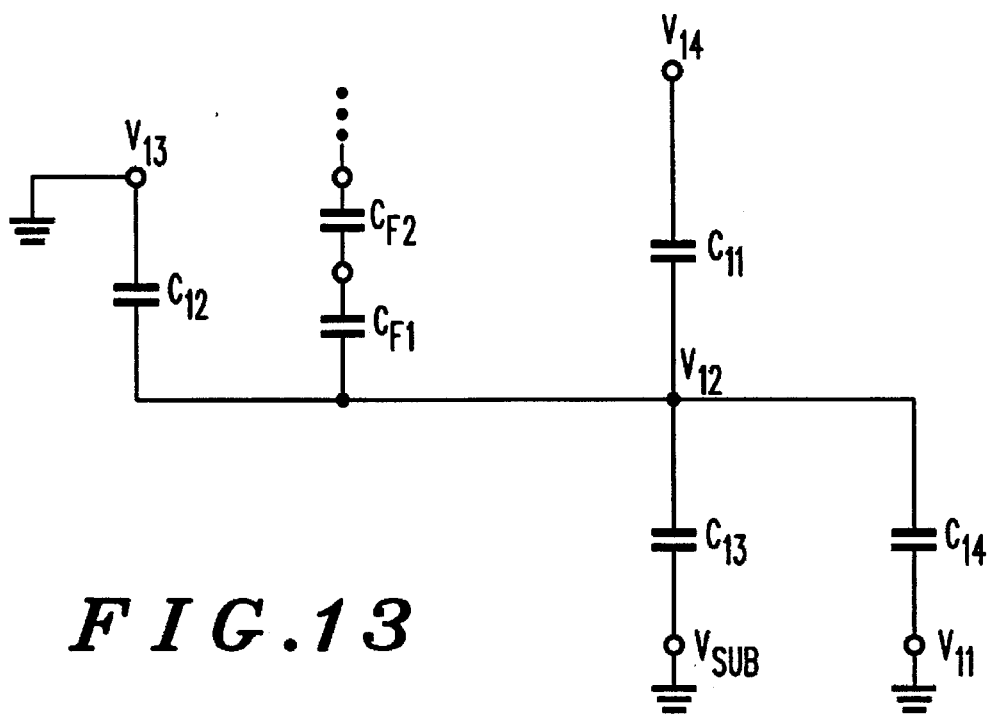
FIG. 13 is an equivalent circuit diagram, in programming mode, of bit blocks including the first layered floating gate of the storage cell of FIGS. 8–10.

How to program (inject electrons into) the first-layered floating gate $4_1$ of the above storage cell transistor is described with reference to FIG. 13. It is appreciated that potentials $V_1$–$V_{14}$ for the electrodes (gates) and potential $V_{SUB}$ for the substrate 1 are shown in FIG. 13.

First, a positive high voltage $V_{14}$ is applied as a bias to the bias gate $8_1$. Then, at the same time, the programming and erasure gates $6_1$ and $7_1$ are dropped to the ground level (0 [V]) as a predetermined reference potential.

Now, applying conservation of charge yields:

$$C_{11}(V_{14}-V_{12})=C_{12}(V_{12}-V_{13})+C_{13}(V_{12}-V_{SUB})+C_{14}(V_{12}-V_{11}) \quad (21)$$

$$V_{12}(C_{11}+C_{12}+C_{13}+C_{14})=C_{11}V_{14}+C_{12}V_{13}+C_{13}V_{SUB}+C_{14}V_{11} \quad (22)$$

Because $V_{13}=V_{11}=V_{SUB}=0$ [V]:

$$V_{12}=C_{11}V_{14}/(C_{11}+C_{12}+C_{13}+C_{14}) \quad (23)$$

Furthermore, if, for example, the bias gate $8_1$ and floating gate $4_1$ are formed as thin oxide films, or the area of the bias gate $8_1$ is substantially increased so that $C_1 \gg C_{12}+C_{13}+C_{14}$, then Eq. 23 is written as approximately $V_{12}=V_{14}$. This causes a voltage of approximately $V_{14}$ to be applied between the floating gate $4_1$ and programming gate $6_1$ or erasure gate $7_1$ (i.e., capacitor $C_{14}$ or $C_{12}$).

Figure 14:
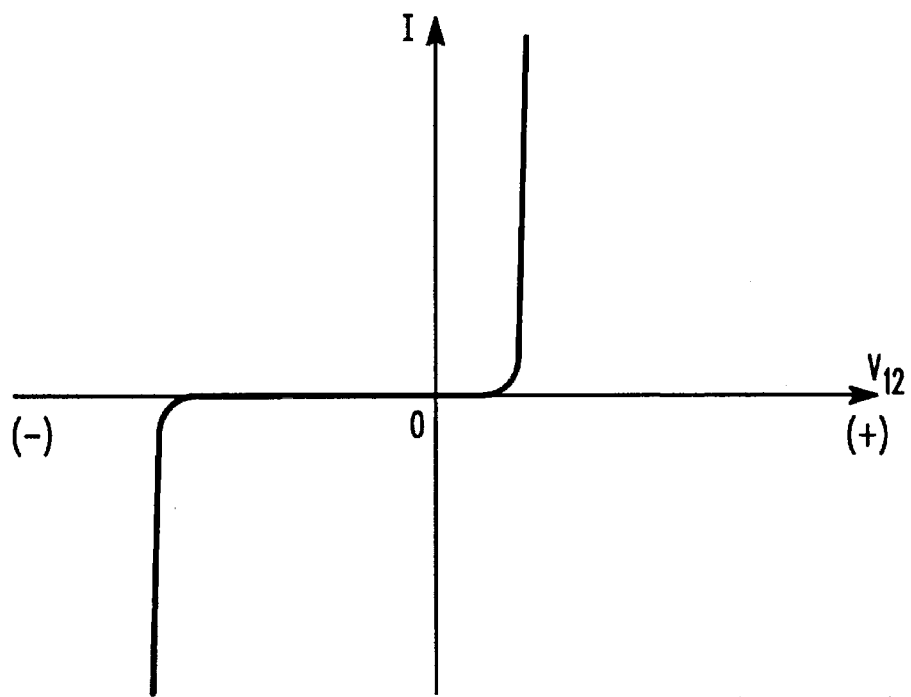
FIG. 14 shows voltage vs. current characteristics for explaining the asperity effect in the storage cell transistor of FIGS. 8–10.
Figure 15:
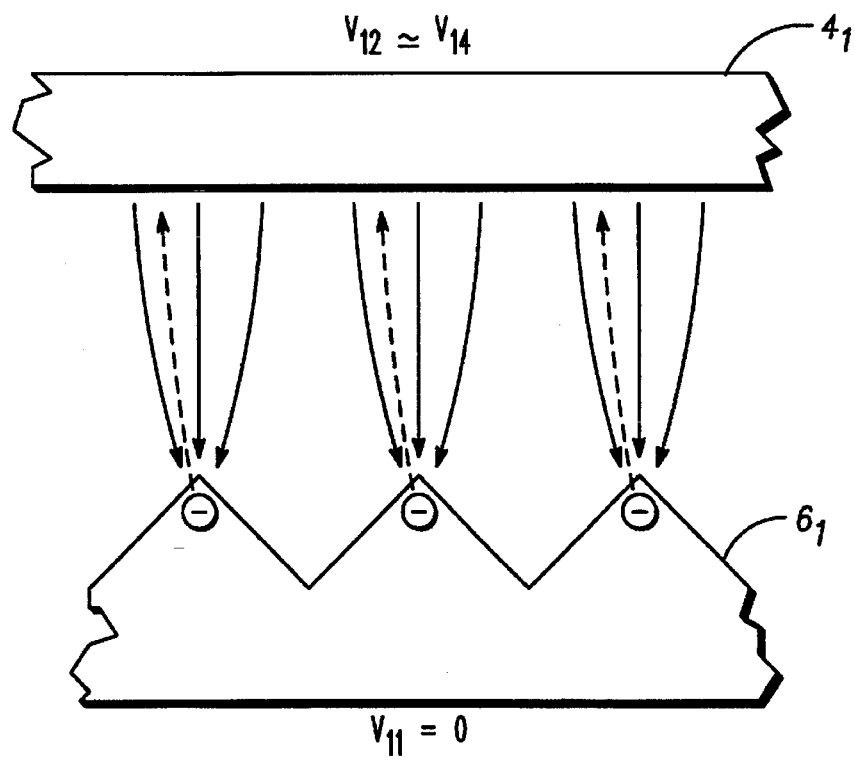
FIG. 15 shows schematically how electric lines of force are formed and how electrons move in the programming mode for the floating gate and program gate of the storage cell transistor of FIGS. 8–10.
Figure 16:
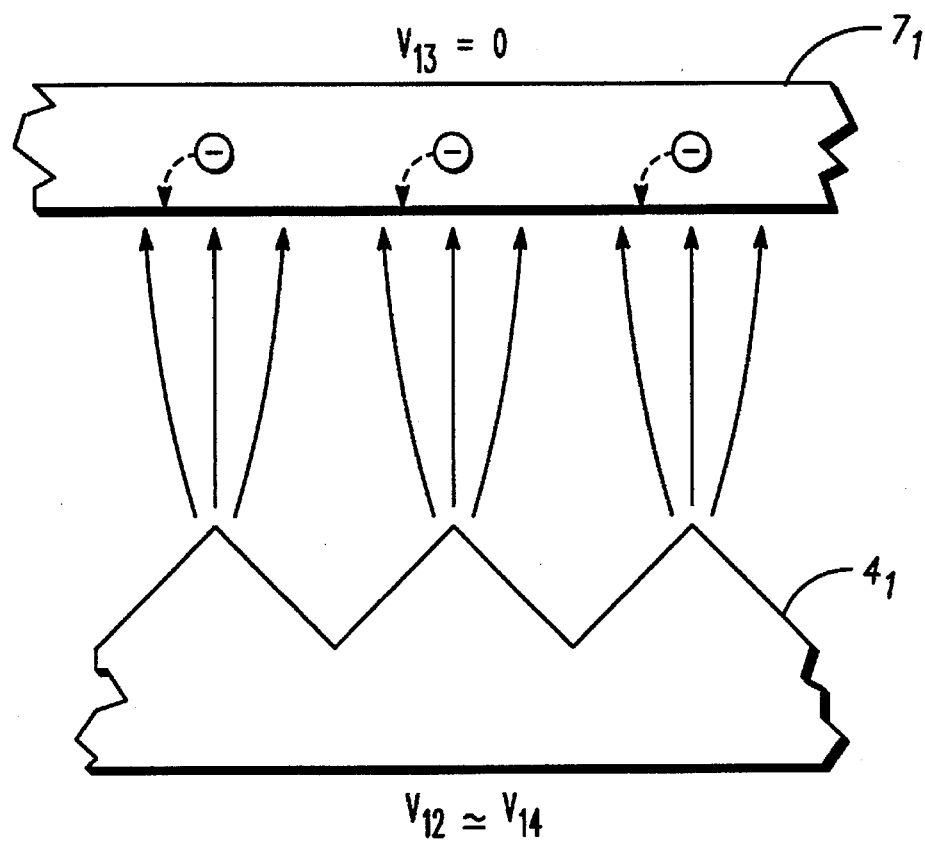
FIG. 16 shows schematically how electric lines of force are formed and how electrons move in the programming mode for the erasure gate and floating gate of the storage cell transistor of FIGS. 8–10.

It is important to note here that as shown in FIG. 9, the surface of the programming gate $6_1$ opposite to the floating gate $4_1$, as well as the surface of the floating gate $4_1$ opposite to the erasure gate $7_1$, has asperities formed thereon. These asperities allow tunnel current (electrons) to flow from the asperity side to the non-asperity side more easily (diode characteristic). This is because the voltage applied during tunneling on the polysilicon having such asperities is substantially lower than that required to tunnel through planar polysilicon without them. More specifically, the threshold for the tunnel current to flow between the polysilicon gate $6_1$ having asperities formed thereon and the polysilicon gate $4_1$ having a planar surface is related to the direction of the voltage $V_{12}$ applied therebetween, as shown in FIG. 14, which is approximately similar to the diode characteristic. In other words, when the potential on the planar polysilicon gate is higher than that on the polysilicon gate having asperities, it tunnels more easily. The electric lines of force and flow of electrons between such planar and asperity surfaces may be depicted as shown in FIG. 15. This indicates that electrons are attracted by the positive potential of the floating gate $4_1$ and collected at the tips of the asperities, where the electric field is concentrated, so it tunnels quite readily. On the other hand, the relationship between the erasure gate $7_1$ and floating gate $4_1$ may be depicted as shown in FIG. 16. In this case, however, although electrons try to move from the erasure gate $7_1$ to the floating gate $4_1$, the electric lines of force are distributed from the tips of the asperities to the erasure gate $7_1$. Since the electron attracting force becomes stronger as the electric lines of force are concentrated, it is quite difficult for electrons to be injected into the erasure gate $7_1$.

Thus, because of the effect of the asperities, the positive voltage of the floating gate $4_1$ raised by the applied voltage $V_{14}$ of the bias gate $8_1$ causes electrons of the tunnel current to flow into the floating gate $4_1$ from the program gate $6_1$. Also in the programming and erasure modes described below, the principle due to a similar effect of the asperities holds true.

In the equivalent circuits of FIGS. 12 and 13, although the capacitances $C_{F1}$–$C_{F3}$ exist between the floating gates, they are connected in series so that they are sufficiently smaller than other capacitances and thus is negligible. These capacitances are omitted in the description that follows.

Figure 17:
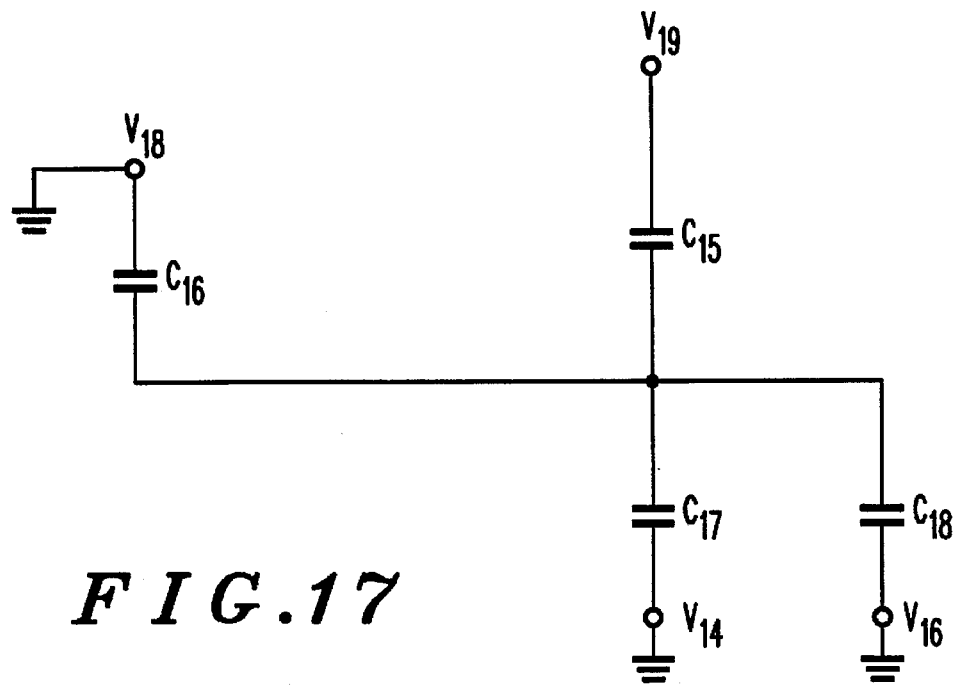
FIG. 17 is an equivalent circuit diagram in the programming mode for the bit blocks including the third-layered floating gate of the storage cell transistor of FIGS. 8–10.

Next, a method for programming (injecting electrons into) the third-layered floating gate $4_3$ is described with reference to FIG. 17. In FIG. 17, too, potentials $V_{14}$, $V_{16}$–$V_{19}$ for the electrodes (gates) are shown.

First, a positive high voltage $V_{19}$ is applied as a bias to the bias gate $8_3$. Then, at the same time, the program gate $6_3$ and erasure gate $7_3$ are dropped to the ground level (0 [V]) as a predetermined reference potential.

Likewise, the voltage $V_{17}$ of third-layered floating gate $4_3$ is expressed as:

$$V_{17}=C_{15}V_{19}/(C_{15}+C_{16}+C_{17}+C_{18}) \quad (24)$$

If designed to yield $C_{15} \gg C_{16}+C_{17}+C_{18}$, then Eq. (24) results in $V_{17}=V_{19}$. This causes a voltage of approximately $V_{17}$ to be applied between the floating gate $4_3$ and programming gate $6_3$ or erasure gate $7_3$ (i.e., capacitor $C_{18}$ or $C_{16}$).

Accordingly, tunnel-current electrons will flow from the program gate $6_3$ into the floating gate $4_3$ due to the positive voltage of the floating gate $4_3$ raised by the applied voltage $V_{19}$ of the bias gate $8_3$.

So far, programming the bit blocks including the first- and third-layered floating gates has been described; for other bit blocks, similar operation may be performed to program them independently.

II. Erasure Mode

Figure 18:
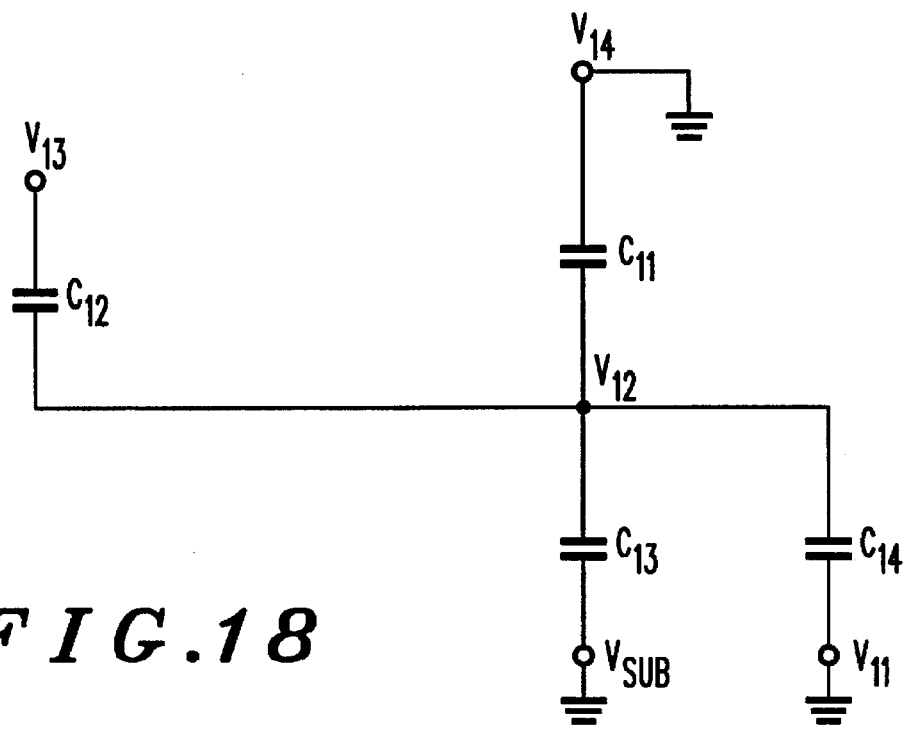
FIG. 18 is an equivalent circuit diagram in the erasure mode for the bit blocks including the first-layered floating gate of the storage cell transistor of FIGS. 8–10.

A method for erasing carriers (pulling out electrons) charged on the first-layered floating gate $4_1$ by the above program mode is described with reference to FIG. 18. It should be noted that potentials $V_{11}$–$V_{14}$ of the electrodes (gates) and potential $V_{SUB}$ of the substrate 1 are shown in FIG. 18.

In this case, a positive high voltage $V_{13}$ is applied as a bias to the erasure gate $7_1$, and the bias gate $8_1$ and program gate $6_1$ are dropped to the ground level (0 [V]) as a predetermined reference potential.

In such a state, the potential $V_{12}$ of the floating gate $4_1$ is derived from conservation of charge, so it is expressed as:

$$V_{12}=C_{12}V_{13}/(C_{11}+C_{12}+V_{13}+C_{14}) \quad (25)$$

So, if designed to yield $C_{11} \gg (C_{12}+C_{13}+C_{14})$, then it results in:

$$V_{12}=C_{12}V_{13}/C_{11}$$

Because $C_{11} \gg C_{12}V_{12}$ is approximately equal to 0.

Thus, a voltage of approximately $V_{13}$ is applied between the floating gate $4_1$ and erasure gate $7_1$ (i.e., capacitor $C_{12}$). Accordingly, the electrons charged on the floating gate $4_1$ is pulled out by the positive voltage $V_{13}$ applied to the erasure gate $7_1$.

Figure 19:
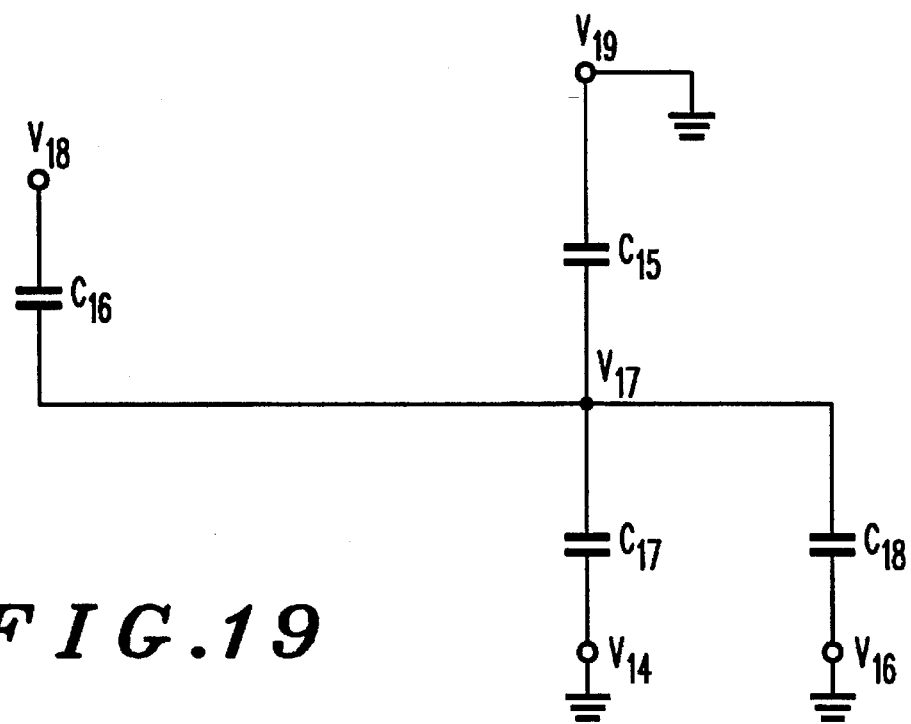
FIG. 19 is an equivalent circuit diagram in the erasure mode for the bit blocks including the third-layered floating gate of the storage cell transistor of FIGS. 8–10.

Next, a method for erasing carriers (pulling out electrons) charged on the third-layered floating gate $4_3$ by the above program mode is described with reference to FIG. 19. It should be noted that potential $V_{14}$, $V_{16}$–$V_{19}$ of the electrons (gates) are shown in FIG. 19.

In this case, too, a positive high voltage $V_{18}$ is applied to the erasure gate $7_3$, and the bias gate $8_3$ and program gate $6_3$ are dropped to the ground level (0 [V]) as a predetermined reference potential.

Likewise, the potential $V_{17}$ of the floating gate $4_3$ is given by:

$$V_{17}=C_{16}V_{18}/(C_{15}+C_{16}+C_{17}+C_{18})$$

So, if $C_{15} \gg (C_{16}+C_{17}+C_{18})$, then $V_{17}=C_{16}V_{18}/C_{15}$. Furthermore, if the condition, $C_{16}/C_{15}=0$ ($C_{15} \gg C_{16}$), is met, then $V_{17}$ is approximately equal to 0.

This causes a voltage of approximately $V_{17}$ to be applied between the floating gate $4_3$ and erasure gate $7_3$ (i.e., capacitor $C_{16}$), so that the electrons charged on the floating gate $4_1$ are pulled out by the positive voltage $V_{18}$ applied to the erasure gate $7_3$.

So far, erasing the stored information for the bit blocks including the first- and third-layered floating gates has been described; for other bit blocks, similar operation may be performed to erase them independently. Although the number of floating gate layers is 4 in the above example, it should be appreciated that the afore-described programming and erasure may be performed for each floating gate even if the number of gates is greater or less than 5. In addition, the floating gates in the L and W directions are denoted as odd-numbered and even-numbered floating gates, respectively: however, conversely, the floating gates in the W and L directions may be configured to provide odd-numbered and even-numbered floating gates, respectively.

In each embodiment described above, the semiconductor substrate 1 was described as p-type silicon; however, it is not limited thereto, but may be n-type silicon, or other semiconductor material. Furthermore, the source and drain, floating gates, program gates, erasure gates, and bias gates, as well as other oxides may be comprised of various kinds of material in various shapes, so the present invention may be modified as appropriate within a scope that can be implemented by those skilled in the art.

Thus, with a non-volatile memory having a cell applying to multi-bit data by multi-layered floating gate architecture of the present invention and programming method for the same, each layered floating gate stores carriers corresponding to each data bit, and a drain-current threshold is determined depending on the amount of capacitance coupling of the carriers so stored, so that a single storage cell can save more than two bits of data. Thus, the real estate for per bit can be reduced, and thus the number of storage cells required for the entire memory may be minimized, thereby contributing to an increased storage capacity of a memory. Especially, because the memory structure of the present invention is comprised of floating gates stacked for bits to be supported, the degree of circuit integration for each cell is substantially increased.

Furthermore, according to the present invention, electrons induced by tunnel current are injected independently into each floating gate by the bias gate to which a positive high voltage is applied and the program and erasure gates which are set at a predetermined reference potential. In addition, electrons injected into each floating gate are emitted independently by the erasure gate to which a positive high voltage is applied and the bias and program gates which are set at a predetermined reference potential.

Accordingly, because tunneling-based programming and erasure apply to such a non-volatile memory, and floating gates are formed so as to cover between the source and drain, the load resistance and parasitic capacitance that may occur while reading the stored data may be minimized, without loss of reading speed.

Furthermore, as compared to a cell transistor of such a structure that an amount of carriers corresponding to a plurality of input bits of data is stored on a single floating gate in an analog manner, the memory of the present invention has an advantage that because each floating gate that stores carriers is independent for each input bit of data, it could be easier to control carrier storage in the programming mode.

What is claimed is:

1. A non-volatile memory having a cell applying to multi-bit data by multi-layered floating gate architecture, which is characterized by a storage cell transistor comprising:

source and drain being formed in a semiconductor substrate distantly from each other so as to form a channel therebetween;

a control gate facing said channel;

a plurality of floating gates arranged in order between said channel and said control gate.

2. A non-volatile memory having a cell applying to multi-bit data by multi-layered floating gate architecture, which is characterized by a storage cell transistor comprising:

source and drain being formed in a semiconductor substrate distantly from each other so as to form a channel therebetween; and a control gate facing said channel, said storage cell transistor further comprising:

at least one first floating gate having a width extending from said source to said drain, said at least one first floating gate extending in a direction crossing to the separating direction of said source and drain, and arranged in order between said channel and said control gate; a first program gate facing one of the extending ends of said first floating gate from said channel; a first erasure gate facing the other extending end of said first floating gate from said control gate;

at least one second floating gate facing said first floating gate, said at least one second floating gate extending in a direction crossing to the extending direction of said first floating gate, arranged in order between said channel and said control gate and overlapping a portion of the first floating gate, said first and second floating gates arranged in alternating order in their respective extending directions between said channel and said control gate; a second program gate facing one of the extending ends of said second floating gate from said channel; a second erasure gate facing the other extending end of said second floating gate from said control gate;

a first bias gate facing said first floating gate from said control gate in locations excluding said overlapping locations where said first and second floating gates overlap with each other; and a second bias gate facing said second floating gate from said control gate in locations excluding said overlapping locations.

3. A non-volatile memory according to claim 2, wherein the surface of said fist program gate facing said first floating gate, the surface of said second program gate facing said second floating gate, the surface of said first floating gate facing said first erasure gate, and the surface of said second floating gate facing said second erasure gate have asperities formed thereon.

4. A non-volatile memory according to claim 2, wherein the extending directions of said first and second floating gates are perpendicular to each other.

5. A method of programming the non-volatile memory according to claim 2, 3 or 4, said method comprising the steps of:

applying a positive high voltage to said first and second bias gates; and setting said first and second program gates and said first and second erasure gates to a predetermined reference potential, and;

injecting electrons produced by the resulting tunnel current into said first and second floating gates.

6. A method of erasing information stored in the non-volatile memory according to claim 2, 3, or 4, said method comprising the steps of:

applying a positive high voltage to said first and second erasure gates; and setting said first and second bias gates and said first and second program gates to a predetermined reference potential.

* * * * *